(12) United States Patent
Nimura (10) Patent No.: US 10,785,866 B2
(45) Date of Patent: Sep. 22, 2020

(54) IMAGE FORMING APPARATUS PROVIDED WITH COMMONIZED PRINTED CIRCUIT BOARD

(71) Applicant: CANON KABUSHIKI KAISHA, Tokyo (JP)

(72) Inventor: Masanori Nimura, Abiko (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/441,683

(22) Filed: Jun. 14, 2019

(65) Prior Publication Data

US 2019/0394873 A1  Dec. 26, 2019

(30) Foreign Application Priority Data

Jun. 26, 2018  (JP) .................................. 2018-121188

(51) Int. Cl.
   *H05K 1/02* (2006.01)
   *G03G 15/01* (2006.01)
   *G03G 15/00* (2006.01)

(52) U.S. Cl.
   CPC ....... *H05K 1/0266* (2013.01); *G03G 15/0105* (2013.01); *G03G 15/80* (2013.01)

(58) Field of Classification Search
   CPC .... H05K 1/0266; H05K 1/0269; G03G 15/80; G03G 21/1642; G03G 21/1652; G03G 2221/166; G03G 2221/1651
   See application file for complete search history.

(56) References Cited

U.S. PATENT DOCUMENTS

| | | | |
|---|---|---|---|
| 8,818,218 B2 | 8/2014 | Naka et al. | |
| 2004/0009002 A1* | 1/2004 | Mori ...................... | G03G 15/80 399/75 |
| 2011/0081154 A1* | 4/2011 | Ueda ...................... | G01R 31/041 399/13 |
| 2012/0038937 A1* | 2/2012 | Son .......................... | G03G 15/80 358/1.1 |
| 2016/0202655 A1* | 7/2016 | Nakajima ............... | G03G 15/80 399/90 |
| 2017/0261901 A1 | 9/2017 | Ikeda | |
| 2018/0103542 A1* | 4/2018 | Shinotsuka ............ | G03G 15/80 |

FOREIGN PATENT DOCUMENTS

JP  2007-301822 A  11/2007

OTHER PUBLICATIONS

Extended European Search Report dated May 15, 2020, in European Patent Application No. 19178658.1.

* cited by examiner

*Primary Examiner* — Thomas S Giampaolo, II
(74) *Attorney, Agent, or Firm* — Venable LLP (57) ABSTRACT

A monochrome image forming apparatus includes an image forming unit that forms a black image, a motor that drives the image forming unit, a control circuit that controls the motor, a first connector to which the motor is connected via a control line, a second connector to which a control target is not connected, and a substrate on which the control circuit, the first connector, and the second connector are arranged. A predetermined mark is formed on the substrate through silk screen printing. A distance between the predetermined mark and the second connector is shorter than a distance between the predetermined mark and the first connector. If the substrate is disposed in a multi-color image forming apparatus configured to form a color image, a control target for the multi-color image forming apparatus is connected to the second connector.

22 Claims, 9 Drawing Sheets

IMAGE FORMING APPARATUS PROVIDED WITH COMMONIZED PRINTED CIRCUIT BOARD

BACKGROUND OF THE INVENTION

Field of the Invention

The present invention relates to an image forming apparatus provided with a commonized printed circuit board.

Description of the Related Art

Image forming apparatuses include multiple types of printers such as monochrome printers and color printers. In recent years, attempts have been made to commonize parts of different types of printers. Japanese Patent Laid-Open No. 2007-301822 proposes commonization of a housing covering a printed circuit board mounted in a printer.

Incidentally, if a commonized printed circuit board that can be mounted in different types of printers is manufactured, the manufacturing cost of printed circuit boards is reduced because the amount of produced printed circuit boards increases. Thus, if a commonized printed circuit board is manufactured, the cost of a printer can be reduced.

However, if a commonized printed circuit board is mounted in a monochrome printer, the number of connectors of cables for the monochrome printer is different from the number of connectors of the printed circuit board, and thus a new issue will arise in maintenance and an assembly process. For example, there is a possibility that an operator will erroneously connect a connector of a cable of the monochrome printer to a connector for a color printer on the commonized printed circuit board. If the connector is erroneously connected, the printer cannot operate normally. Also, if the connector is erroneously connected, there is a possibility that a pin of the connector will be bent. Even if a connector with a bent pin is connected to a correct connector of the printed circuit board, this connector is likely to cause connection failure. Thus, the printer to which a connector with a bent pin is connected cannot operate normally.

SUMMARY OF THE INVENTION

The present invention provides a monochromatic image forming apparatus an image forming unit configured to form a black image, a motor configured to drive the image forming unit, a control circuit configured to control the motor, a first connector to which the motor is connected via a control line, a second connector to which a control target is not connected, and a substrate on which the control circuit, the first connector, and the second connector are arranged. A predetermined mark is formed on the substrate through silk screen printing. A distance between the predetermined mark and the second connector of the substrate is shorter than a distance between the predetermined mark and the first connector of the substrate. If the substrate is disposed in a multi-color image forming apparatus configured to form a color image, a control target for the multi-color image forming apparatus is connected to the second connector.

Further features of the present invention will become apparent from the following description of exemplary embodiments with reference to the attached drawings.

DESCRIPTION OF THE EMBODIMENTS

First Embodiment

According to an embodiment, a printed circuit board that can be built in both a color printer that forms a color image and a monochrome printer that forms a monochromatic image is provided. The printed circuit board includes a first connector, a second connector, and a mark. The first connector is used in both a color printer and a single-color printer. The second connector is used in a color printer, and is not used in a single-color printer. The mark is a mark for distinguishing between the first connector and the second connector, and is provided on at least one of the first connector and the second connector. Accordingly, if a commonized printed circuit board is used in both a monochrome printer and a color printer, it is possible to avoid an error in attaching a cable.

Color Image Forming Apparatus

Figure 1:
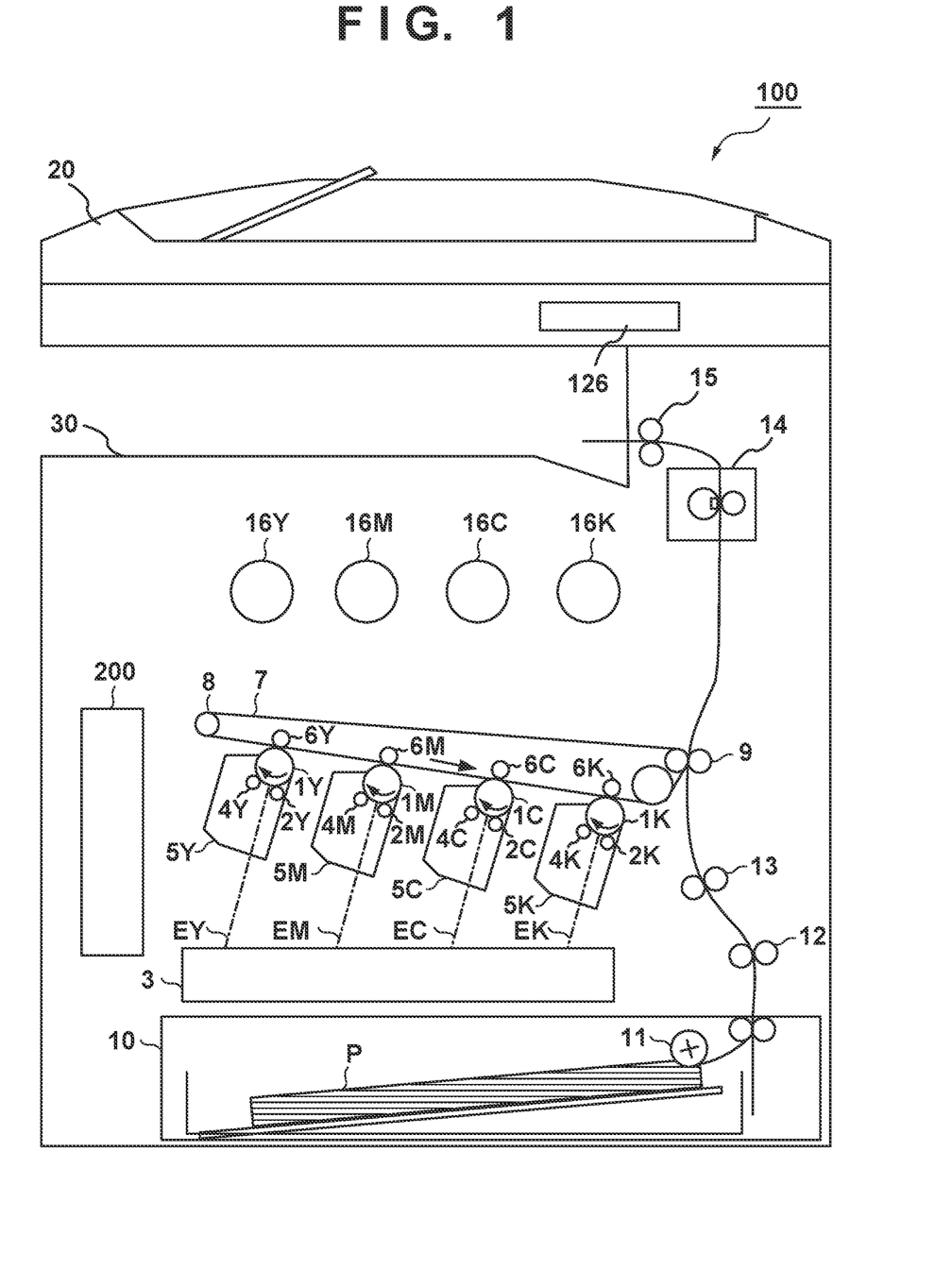
FIG. 1 is a schematic cross-sectional view of an image forming apparatus including a reader and a color printer.

FIG. 1 is a schematic cross-sectional view of an image forming apparatus 100 including a reader 20 and a color printer 30. Note that the reader 20 may be omitted. The color printer 30 forms a toner image using yellow, magenta, cyan, and black toner. The letters Y, M, C, and K provided at the end of reference numerals respectively mean yellow, magenta, cyan, and black. When content shared by configurations for forming a toner image having each color is described, the above-described letters (Y, M, C, and K) will be omitted. A photosensitive drum 1 is an aluminum cylinder provided with a photosensitive layer on its surface. The photosensitive drum 1 functions as a photoreceptor. A laser scanner 3 has a light source, and exposes the photosensitive drum 1 to light emitted from the light source. Accordingly, an electrostatic latent image is formed on the photosensitive drum 1. A process cartridge 5 has a charging roller 2 and a development sleeve 4. The charging roller 2 evenly charges the surface of the photosensitive drum 1. Note that the image forming apparatus 100 may have a charging wire instead of the charging roller 2. The development sleeve 4 develops an electrostatic latent image using toner stored in the process cartridges 5. Accordingly, a toner image is formed on the photosensitive drum 1.

A primary transfer roller 6 transfers the toner image formed on the photosensitive drum 1 to an intermediate transfer member 7. Note that the image forming apparatus 100 may have a primary transfer blade instead of the primary transfer roller 6. The intermediate transfer member 7 is an endless belt, is driven by a drive roller 8, and rotates. Note that the intermediate transfer member 7 is not limited to a belt, and may be a tubular metal roller (referred to as an intermediate transfer drum). Toner images having different colors are superimposed and transferred onto the intermediate transfer member 7 to form a full-color toner image. The intermediate transfer member 7 conveys the toner image to a secondary transfer portion. The secondary transfer portion is a nip portion located between the intermediate transfer member 7 and a secondary transfer roller 9.

A cassette 10 houses sheets P. A pickup roller 11 picks up a sheet P and sends the sheet P to a conveyance path. Conveyance rollers 12 provided on the conveyance path convey the sheet P to registration rollers 13. The registration rollers 13 supply the sheet P to the secondary transfer portion such that a timing when the toner image reaches the secondary transfer portion and a timing when the sheet P reaches the secondary transfer portion coincide with each other.

The secondary transfer portion is constituted by the intermediate transfer member 7 and the secondary transfer rollers 9. The secondary transfer rollers 9 convey the sheet P while holding the sheet P together with the intermediate transfer member 7, and thus transfer the toner image carried by the intermediate transfer member 7 to the sheet P. The sheet P to which the toner image is transferred is conveyed to a fixing device 14. The fixing device 14 includes a heater for heating the toner image on the sheet P, and a pair of rotary members that convey the sheet P while holding the sheet P on which the toner image is carried. The fixing device 14 applies heat and pressure to the toner image and the sheet P using the heater and the rotary members, and fixes the toner image onto the sheet P. Discharge rollers 15 discharge the sheet P to which the toner image is fixed by the fixing device 14 onto a discharge tray.

A toner container in which toner is housed is mounted on a mounting portion 16. Toner stored in the process cartridge 5 is consumed as a result of forming a toner image. The image forming apparatus 100 replenishes the process cartridge 5 with toner from the toner container mounted on the mounting portion 16. The image forming apparatus 100 replenishes the process cartridge 5 with toner from the toner container as a result of rotation of the toner container. Note that the image forming apparatus 100 may insert a paddle into the toner container and rotate this paddle, and thus replenish the process cartridge 5 with toner from the toner container. The toner container functions as a toner replenishing unit.

An operation panel 126 includes a display and a plurality of keys for inputting information. Note that the operation panel 126 may be a touch panel display having no keys. The operation panel 126 is connected to a printed circuit board 200.

Monochromatic Image Forming Apparatus

Figure 2:
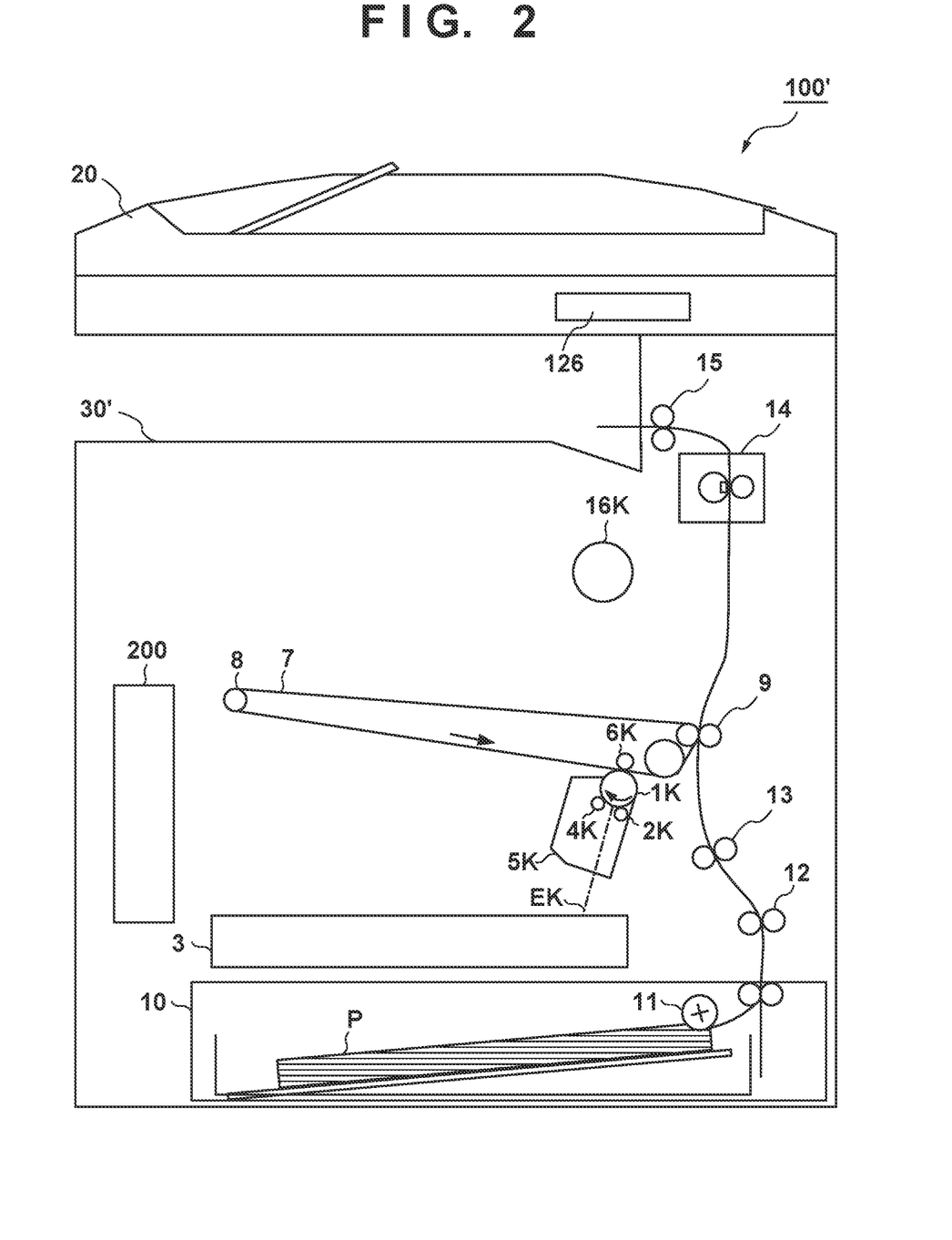
FIG. 2 is a schematic cross-sectional view of an image forming apparatus including a reader and a monochrome printer.

FIG. 2 is a schematic cross-sectional view of an image forming apparatus 100' including a reader 20 and a monochrome printer 30'. Constituent elements of the image forming apparatus 100' that are the same as those of the image forming apparatus 100 shown in FIG. 1 are given the same reference numerals. Also, the same constituent elements will not be described. The image forming apparatus 100' shown in FIG. 2 is the image forming apparatus 100 shown in FIG. 1 with the parts for color printing removed. The image forming apparatus 100' shown in FIG. 2 is a subset of the image forming apparatus 100 shown in FIG. 1. Thus, the image forming apparatus 100' shown in FIG. 2 and the image forming apparatus 100 shown in FIG. 1 can share many parts including the printed circuit board 200. Thus, it is possible to reduce the manufacturing cost of the image forming apparatuses 100 and 100'. Parts of the image forming apparatus 100' are the same as parts of the image forming apparatus 100, and thus a description thereof will be omitted.

Printed Circuit Board

Figure 3:
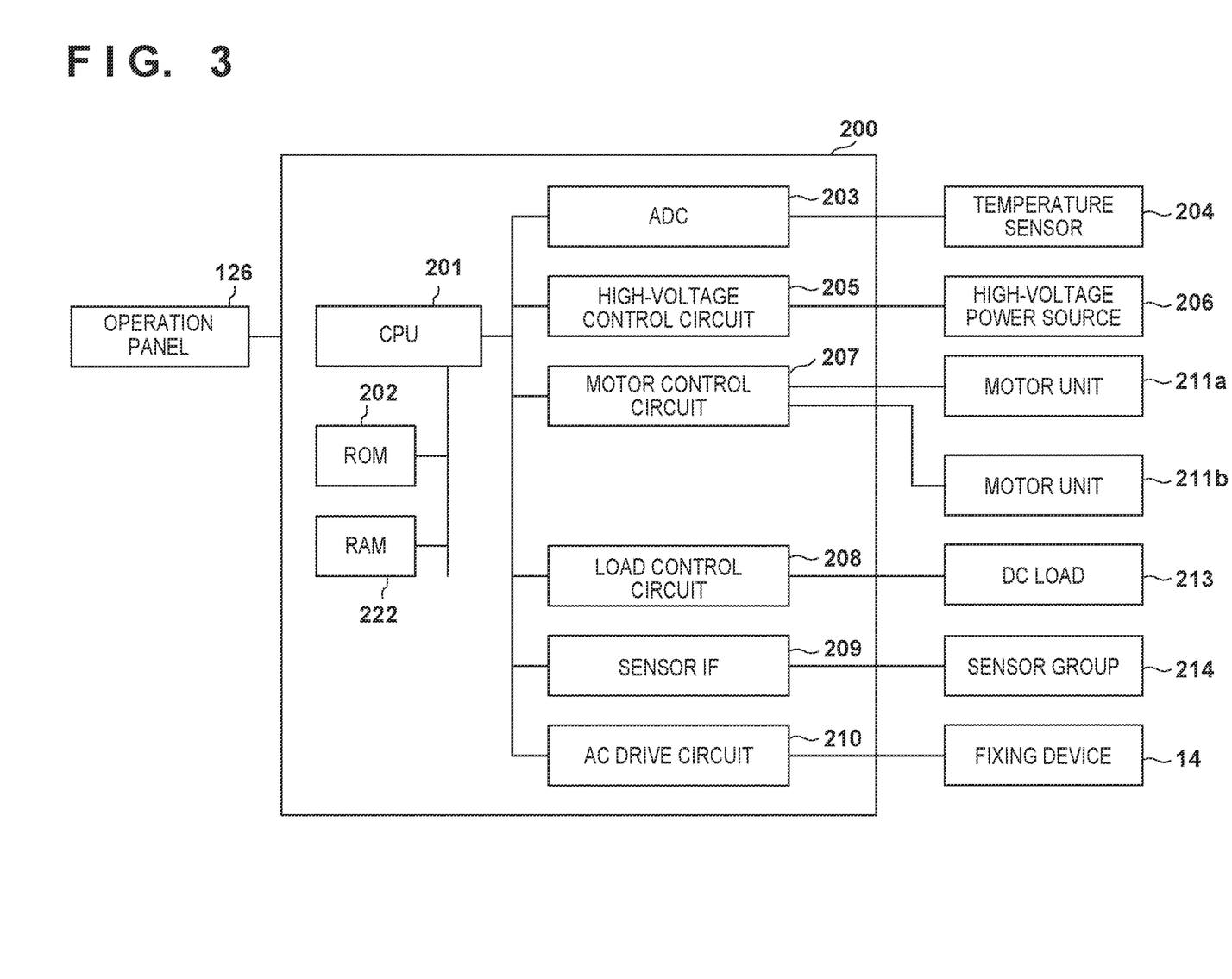
FIG. 3 is a schematic diagram showing a relationship between a printed circuit board and control targets.

FIG. 3 is a schematic diagram showing a relationship between the printed circuit board 200 and control targets. The printed circuit board 200 controls units of the image forming apparatuses 100 and 100'. The printed circuit board 200 can be mounted in both the image forming apparatus 100 that forms color images and the image forming apparatus 100' that forms monochromatic images. A CPU 201 is a control circuit that performs overall control of the image forming apparatus 100 (or the image forming apparatus 100'). Control programs for controlling various types of processing are stored in a ROM 202. The CPU 201 executes various control sequences according to control programs stored in the ROM 202. A RAM 222 stores temporary data regarding control sequences. The RAM 222 functions as a system work memory used by the CPU 201 for arithmetic processing. Also, the CPU 201 displays information on a display of the operation panel 126, and receives information and instructions input from the operation panel 126 using a plurality of keys.

Figure 4:
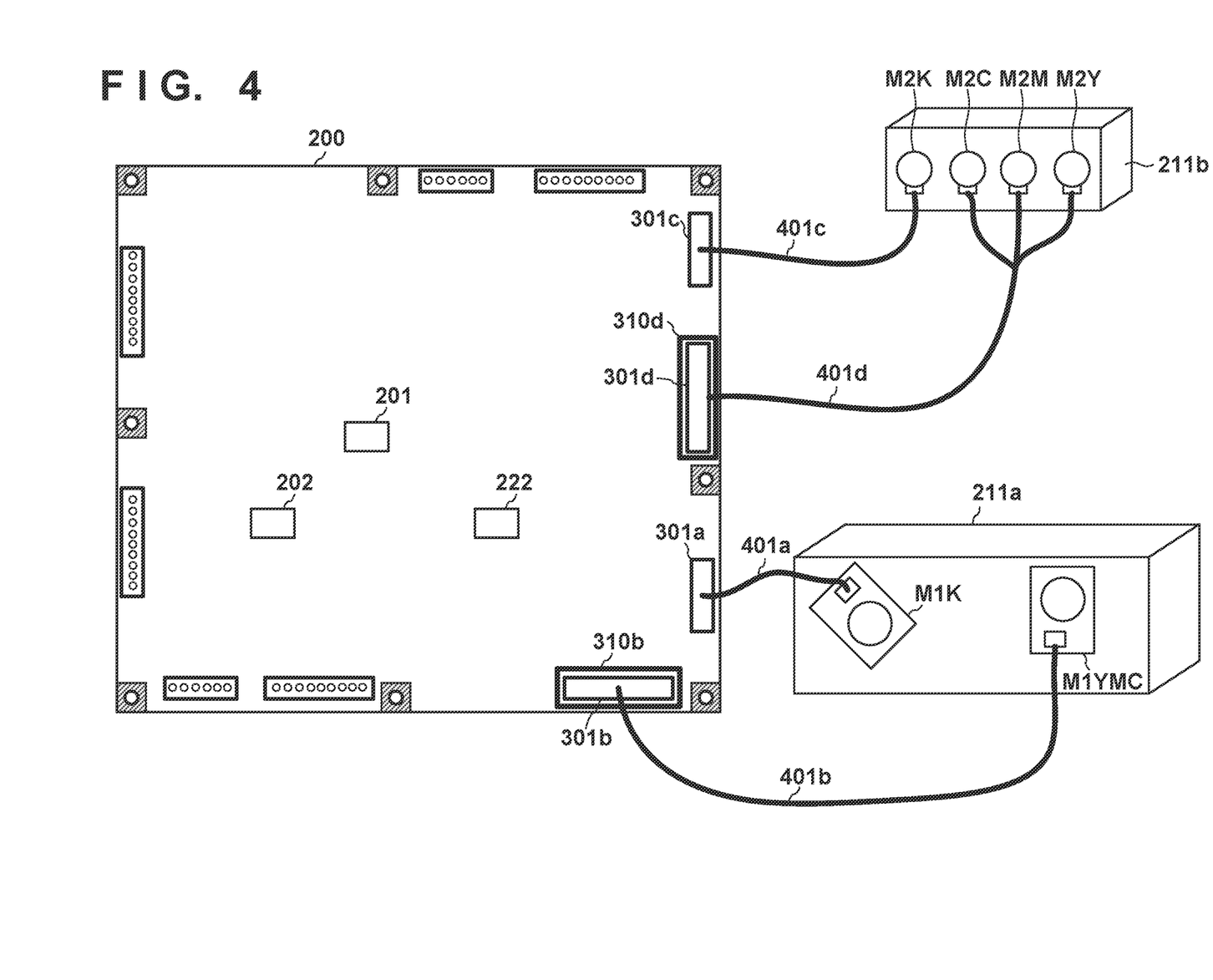
FIG. 4 is a schematic diagram of main portions of a printed circuit board of a first embodiment.

An ADC 203 is an analog-digital converter that converts an electric current output from a temperature sensor 204 to a digital signal. The temperature sensor 204 outputs an electric current corresponding to the temperature of the fixing device 14. A high-voltage control circuit 205 controls a high-voltage power source 206. The high-voltage power source 206 generates a charging voltage to be applied to the charging roller 2, a development voltage to be applied to the development sleeve 4, a primary transfer voltage to be applied to the primary transfer roller 6, and a secondary transfer voltage to be applied to the secondary transfer rollers 9. A motor control circuit 207 controls motor units 211*a* and 211*b*. The motor unit 211*a* includes motors M1K and M1YMC that are shown in FIG. 4, the motors M1K and M1YMC driving the photosensitive drum 1 and the development sleeve 4. The motor unit 211*b* includes motors M2Y, M2M, M2C, and M2K, which are shown in FIG. 4, for rotating the toner containers mounted on the mounting portions 16. A load control circuit 208 controls a DC load 213. The DC load 213 includes a solenoid and a clutch that are driven to convey the sheet P. A sensor IF 209 is an interface circuit that transfers a detection signal output by a sensor group 214 to the CPU 201. The sensor group 214 includes an inductance sensor and a photo-interrupter. An AC drive circuit 210 controls the alternating electric current flowing to the heater of the fixing device 14. For example, the CPU 201 controls an alternating electric current flowing to the heater of the fixing device 14 such that the temperature measured by the temperature sensor 204 reaches a target temperature.

Connection Between Connectors and Motor Units

FIG. 4 is a schematic diagram of main portions of the printed circuit board 200 mounted in the color printer 30. A plurality of connectors including connectors 301*a*, 301*b*, 301*c*, and 301*d* are arranged on the printed circuit board 200.

The motor unit 211*a* includes the motor M1YMC that drives the photosensitive drums 1Y, 1M, and 1C and the development sleeves 4Y, 4M, and 4C, and the motor M1K that drives the photosensitive drum 1K and the development sleeve 4K. A control line 401*a* is a signal cable for communicably connecting the motor control circuit 207 and the motor M1K. A control line 401*b* is a signal cable for communicably connecting the motor control circuit 207 and the motor M1YMC. A connector of the control line 401a is connected to the connector 301a. The motor control circuit 207 outputs a control signal to the motor M1K through the control line 401a. A connector of the control line 401b is connected to the connector 301b. The motor control circuit 207 outputs a control signal to the motor M1YMC through the control line 401b. The control line 401a is an example of a control line for transferring a control signal to a first driving source that drives a first image forming unit that forms a toner image using toner having a first color (e.g., black). The motor M1K is an example of the first driving source. The control line 401b is an example of a control line for transferring a control signal to a second driving source that drives a second image forming unit that forms a toner image using toner having a second color that is different from the first color. The motor M1YMC is an example of the second driving source.

The motor unit 211b includes motors M2Y, M2M, M2C, and M2K that drive the toner containers mounted on the mounting portions 16Y, 16M, 16C, and 16K. A control line 401c is a signal cable for communicably connecting the motor control circuit 207 and the motor M2K. A control line 401d is a signal cable for communicably connecting the motor control circuit 207 and the motors M2Y, M2M, and M2C. A connector of the control line 401c is connected to the connector 301c. The motor control circuit 207 outputs a control signal to the motor M2K through the control line 401c. A connector of the control line 401d is connected to the connector 301d. The motor control circuit 207 outputs control signals to the motors M2Y, M2M, and M2C through the control line 401d. The control line 401c is an example of a control line for transferring a control signal to a third driving source that supplements, with toner from the first toner container, the first image forming unit that forms a toner image using toner having the first color. The motor M2K is an example of the third driving source. The toner container mounted on the mounting portion 16K is an example of the first toner container. The control line 401d is an example of a control line for transferring a control signal to a fourth driving source that supplements, with toner from a second toner container, the second image forming unit that forms a toner image using toner having the second color that is different from the first color. The motors M2Y, M2M, and M2C are examples of the fourth driving source. The toner container mounted on the mounting portion 16Y is an example of the second toner container. Note that the second toner container may be a toner container mounted on the mounting portion 16M, or a toner container mounted on the mounting portion 16C. The first color may be black. The second color may be a chromatic color such as yellow, magenta, or cyan.

Reasons to Make Connectors Visually Identifiable

A mark 310b is provided around the connector 301b of the printed circuit board 200 shown in FIG. 4, and a mark 310d is provided around the connector 301d of the printed circuit board 200. That is, marks are provided around the connectors 301b and 301d dedicated to the color printer 30'. Note that the marks 310b and 310d are printed on the printed circuit board 200 through silk screen printing. On the other hand, no marks are provided around the connectors 301a and 301c of the printed circuit board 200 shown in FIG. 4. That is, no marks are provided around the shared connectors 301a and 301c.

The image forming apparatus 100' that forms monochromatic images is designed based on the image forming apparatus 100 that forms full color images. The image forming apparatus 100' has functions that are equivalent to those of the image forming apparatus 100, except that the image forming apparatus 100' cannot form yellow, magenta, and cyan toner images. The image forming apparatus 100' is different from the image forming apparatus 100 in that the image forming apparatus 100' does not have the process cartridges 5Y, 5M, and 5C and the motors M1YMC, M2Y, M2C, and M2M. Note that in the image forming apparatus 100', the mounting portions 16Y, 16M, and 16C are covered by a cover such that the toner container housing black toner is not erroneously mounted on the mounting portions 16Y, 16M, or 16C.

Figure 5:
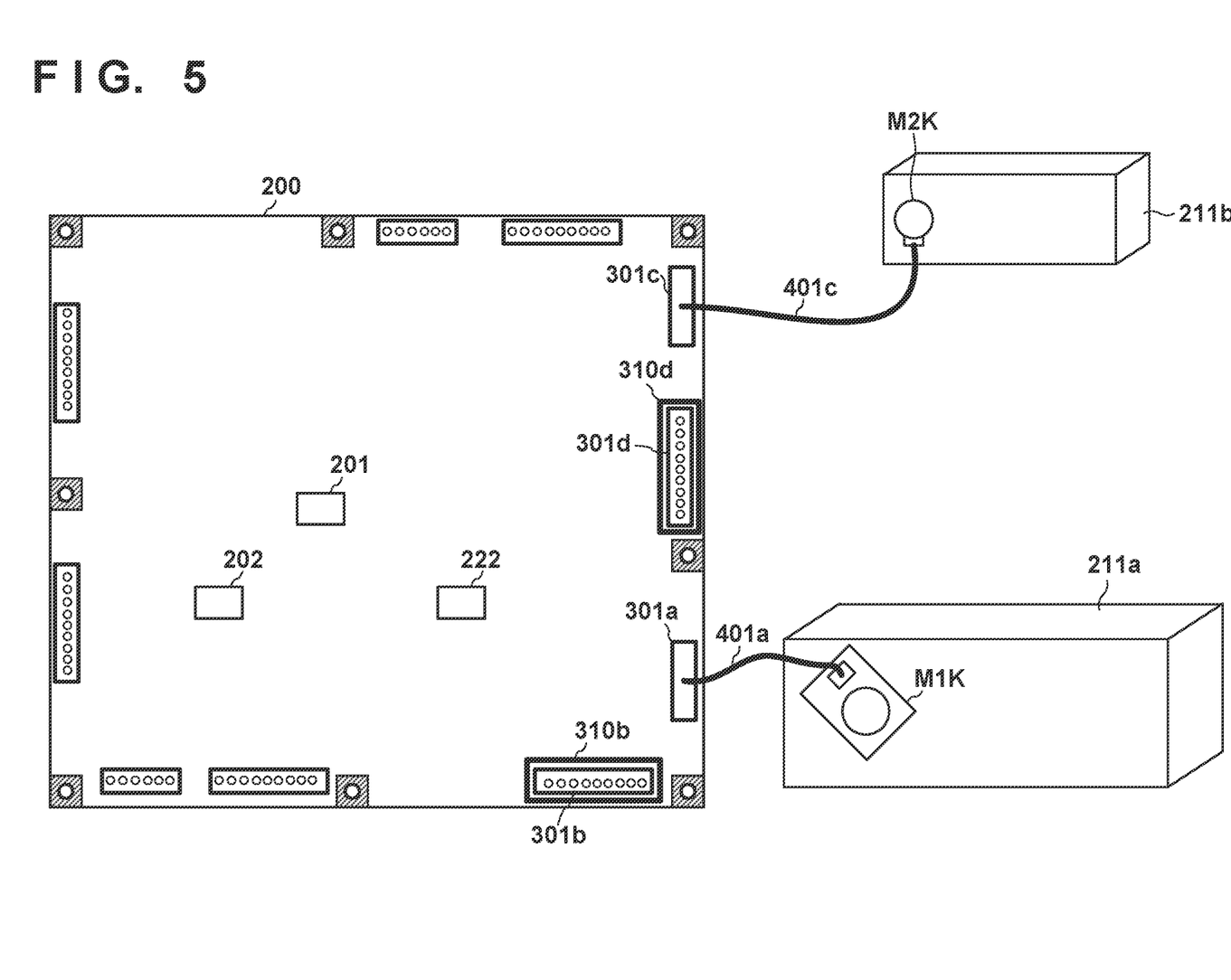
FIG. 5 is a schematic diagram of the main portions of the printed circuit board of the first embodiment.

FIG. 5 is a schematic diagram of main portions of the printed circuit board 200 mounted in the monochrome printer 30'. The printed circuit board 200 shown in FIG. 5 is the same as the printed circuit board 200 shown in FIG. 4. As shown in FIG. 5, if the printed circuit board 200 is mounted in the monochrome printer 30', there are no connectors of control lines for connection to the connectors 301b and 301d of the printed circuit board 200. On the other hand, the connector 301a of the printed circuit board 200 is connected to the connector of the control line 401a, and the connector 301c of the printed circuit board 200 is connected to the connector of the control line 401c. Thus, as shown in FIG. 5, the monochrome printer 30' does not need control lines 401b or 401d. Therefore, an operator connects the control line 401a to the connector 301a, and connects the control line 401c to the connector 301c in a process for manufacturing the image forming apparatus 100', a process for assembling the image forming apparatus 100', and maintenance of the image forming apparatus 100'.

Incidentally, the connectors 301a and 301c to which motors for the monochrome printer 30' are connected are different from the connectors 301b and 301d to which the motors for the color printer 30 are connected. If the printed circuit board 200 is mounted in the monochrome printer 30', the control lines 401a and 401c for the monochrome printer 30' are connected to the connectors 301a and 301c, and the control lines 401b and 401d for the color printer 30 are not connected to any connectors. That is, the control lines 401b and 401d are parts dedicated to the color printer 30. On the other hand, the control lines 401a and 401c for black are commonized parts that are connected to the connectors 301a and 301c of both the monochrome printer 30' and the color printer 30. That is, the printed circuit board 200 and the control lines 401a and 401c are commonized parts.

As shown in FIG. 5, if the printed circuit board 200 is mounted in the monochrome printer 30', the connectors of the control lines are not connected to the connectors 301b and 301d. Thus, in the printed circuit board 200 shown in FIG. 5, the marks 310b and 310d are provided around the connectors 301b and 301d. The marks 310b and 310d indicate that the connectors 301b and 301d are not connected to the connectors of the control lines when the printed circuit board 200 is mounted in the monochrome printer 30'. An operator can easily determine whether or not the connectors of the control lines are to be connected to the connectors 301b and 301d of the printed circuit board 200, based on whether or not the marks 310b and 310d are provided. Thus, the marks 310b and 310d printed on the printed circuit board 200 are effective for inhibiting an operator from erroneously connecting the control lines 401a and 401c to the connectors 301b and 301d in an assembly operation and a maintenance operation. Also, no marks are provided around the connectors 301a and 301c of the printed circuit board 200. Thus, if the printed circuit board 200 is mounted in the monochrome printer 30', an operator can easily recognize that the connectors of the control lines 401a and 401c are to be connected to the connectors 301a and 301c.

In this manner, the connector 301a of the printed circuit board 200 is an example of a commonized connector (a first connector) that is used in both the monochrome printer 30' and the color printer 30. The connector 301b of the printed circuit board 200 is an example of a dedicated connector (a second connector) that is used in the monochrome printer 30' and is not used in the color printer 30. The connector 301c of the printed circuit board 200 is an example of another commonized connector (a third connector) that is used in both the monochrome printer 30' and the color printer 30. The connector 301d of the printed circuit board 200 is an example of another dedicated connector (a fourth connector) that is used in the monochrome printer 30' and is not used in the color printer 30. The marks 310b and 310d of the printed circuit board 200 are marks for distinguishing between a commonized connector and a dedicated connector, and are examples of a mark that is formed around a dedicated connector.

Figure 6:
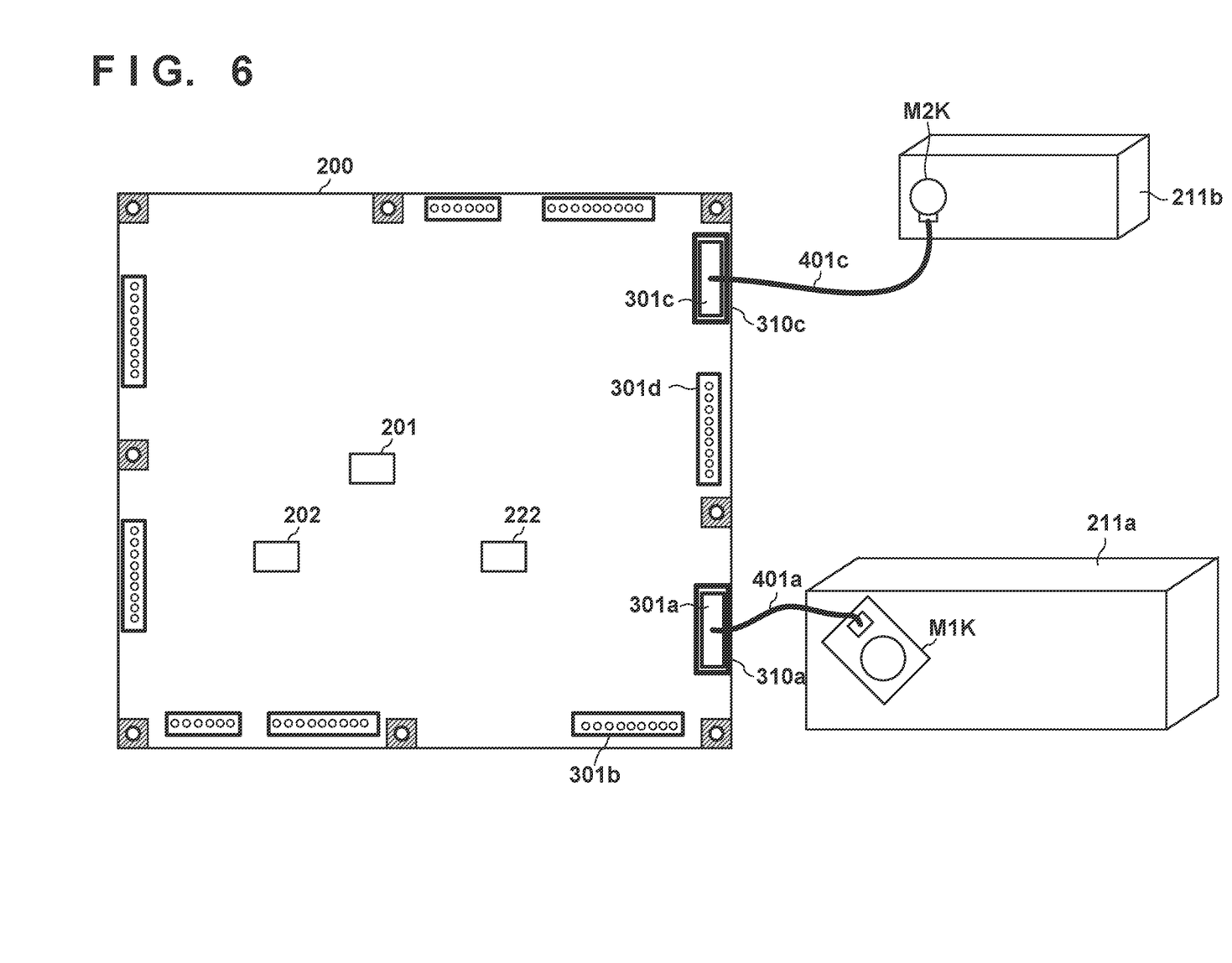
FIG. 6 is a schematic diagram of main portions of another printed circuit board mounted in a monochrome printer.

Next, a variation of the present invention will be described. FIG. 6 is a schematic diagram of main portions of a variation of the printed circuit board 200 mounted in the monochrome printer 30'. The printed circuit board 200 shown in FIG. 6 is the same as the printed circuit board 200 shown in FIG. 4 or 5. As shown in FIG. 6, if the printed circuit board 200 is mounted in the monochrome printer 30', there are no connectors of control lines for connection to connectors 301b and 301d of the printed circuit board 200. On the other hand, a connector 301a of the printed circuit board 200 is connected to a connector of a control line 401a, and a connector 301c of the printed circuit board 200 is connected to a connector of a control line 401c.

A mark 310a is provided around the connector 301a of the printed circuit board 200 shown in FIG. 6, and a mark 310c is provided around the connector 301c of the printed circuit board 200. On the other hand, no marks are provided around the connectors 301b and 301d of the printed circuit board 200 shown in FIG. 6. In this manner, a configuration is possible in which the printed circuit board 200 is provided with marks around commonized connectors that are used in both the monochrome printer 30' and the color printer 30, and is not provided with a mark around a dedicated connector that is used only in the color printer 30. Also, as another variation of the printed circuit board 200, a configuration is possible in which first marks are provided around the connectors 301b and 301d, and second marks that are different from the first marks are provided around the connectors 301a and 301c. In this case, the first marks that are provided for the connectors 301b and 301d and the second marks that are provided for the connectors 301a and 301c need to be visually distinguishable marks.

Figure 7A:
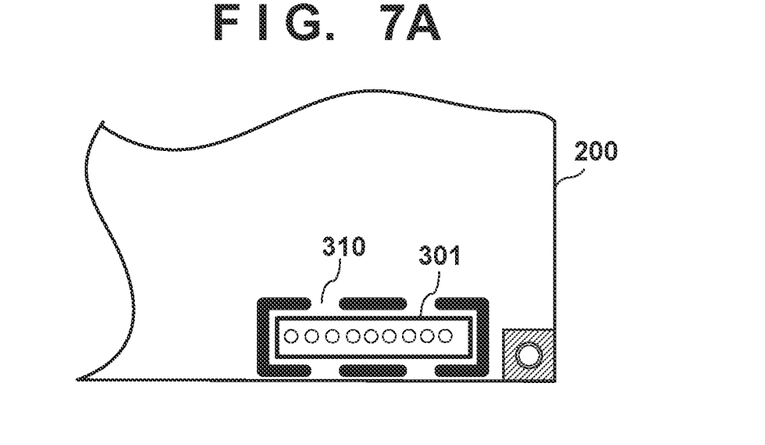
FIGS. 7A to 7C are other exemplary diagrams of marks printed on a printed circuit board.
Figure 7B:
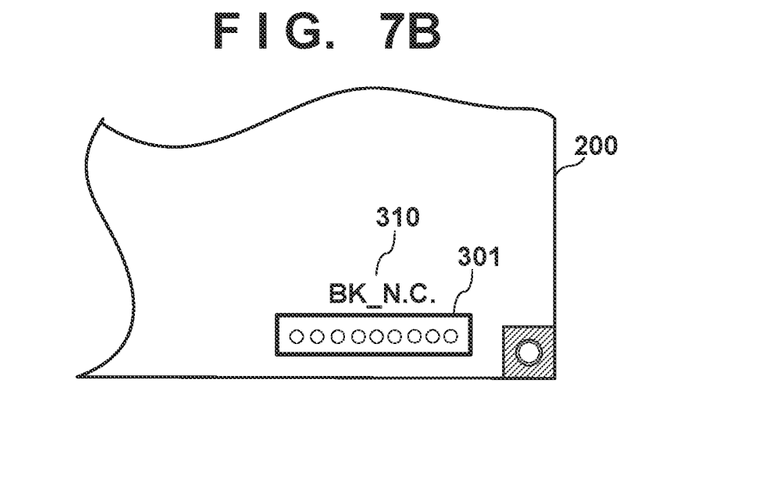
Figure 7C:
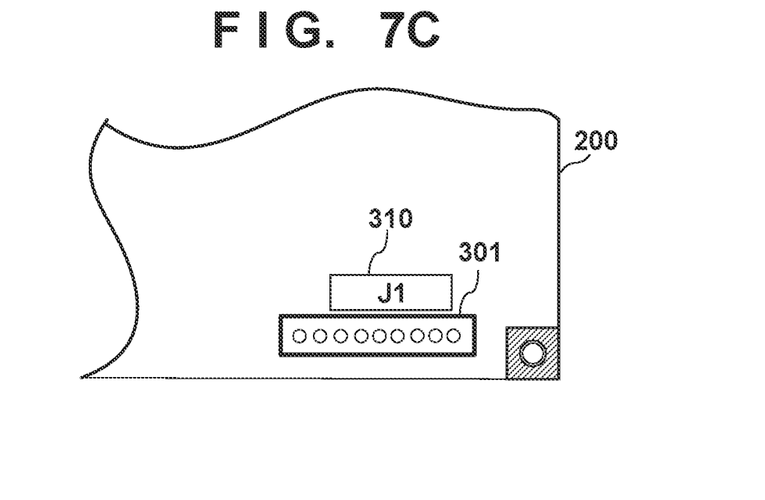

Also, FIGS. 7A, 7B, and 7C show other examples of the mark 310. A mark 310 shown in FIG. 7A is a broken line provided around the connector 301 through silk screen printing. A mark 310 shown in FIG. 7B is formed of letters provided around the connector 301 through silk screen printing. These letters may indicate that a control line is not connected to this connector in the monochrome printer 30'. A mark 310 shown in FIG. 7C is a frame line provided to enclose a number (connector number) for specifying a connector. Connector numbers are pieces of unique identification information that are provided to a plurality of connectors provided on a printed circuit board. A connector number is provided in the vicinity of the connector 301 through silk screen printing. The mark 310 is also provided through silk screen printing. Also, marks having different colors may be provided on the printed circuit board 200 such that an operator can determine whether or not a control line is to be connected to each connector. For example, in the image forming apparatus 100', a mark in a first color (e.g., white) may be provided for a connector to which a cable is to be connected, and a mark in a second color (e.g., yellow) may be provided for a connector to which no cable is to be connected.

As shown in FIG. 6, a mark may be provided around a commonized connector, and is not necessarily provided around a dedicated connector. Alternatively, as shown in FIG. 4, a mark may be provided around a dedicated connector, and is not necessarily provided around a commonized connector. A mark may be provided to enclose the connector 301 on the printed circuit board 200. As shown in FIG. 7B, the mark 310 may be a letter, a figure, or a symbol provided in the vicinity of the connector 301. Also, as shown in FIG. 7C, the mark 310 may be a mark provided on information (e.g., connector numbers) for identifying a plurality of connectors 301. Such information may also be referred to as connector identification information.

Second Embodiment

Figure 8:
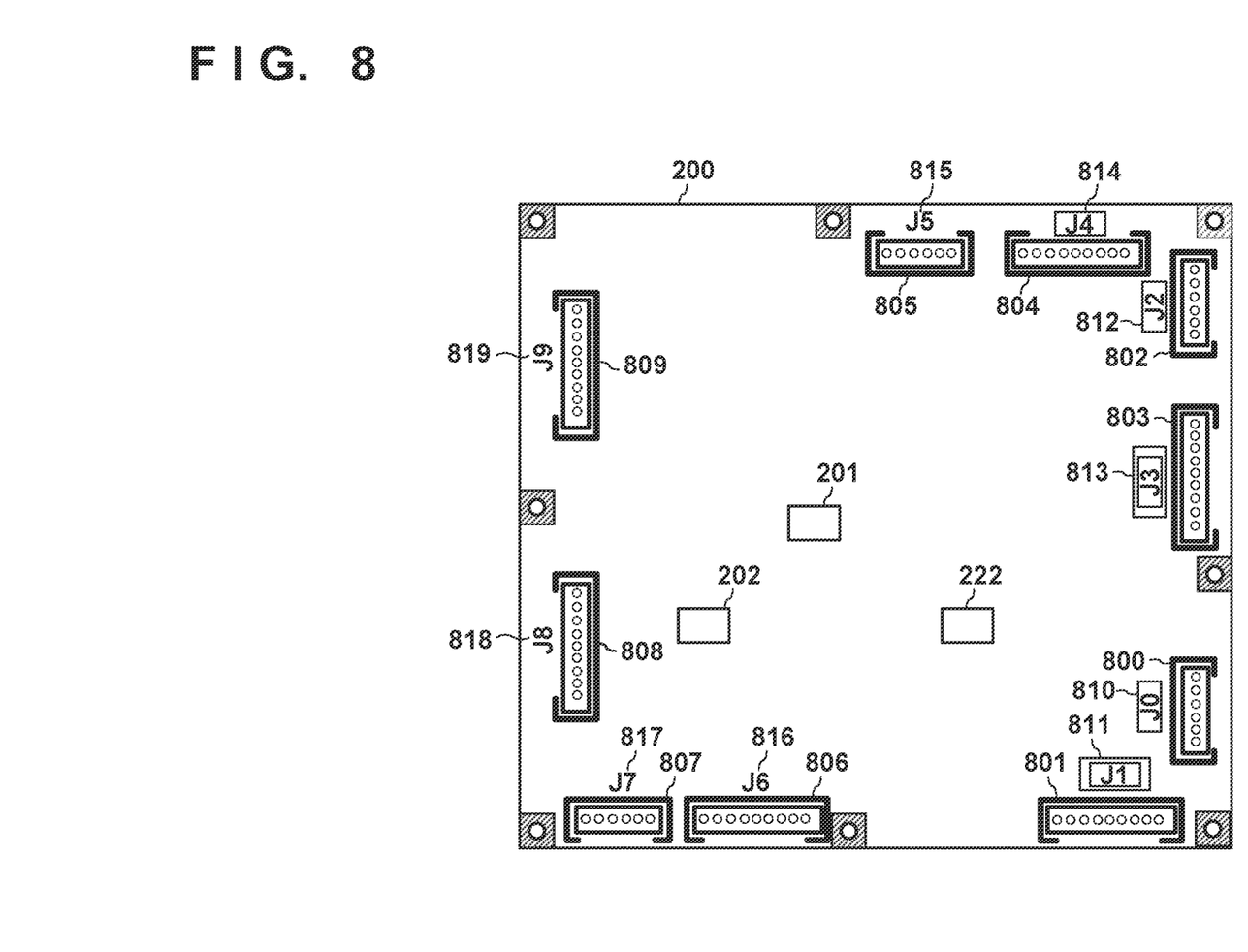
FIG. 8 is a schematic diagram of main portions of a printed circuit board of a second embodiment.
Figure 9A:
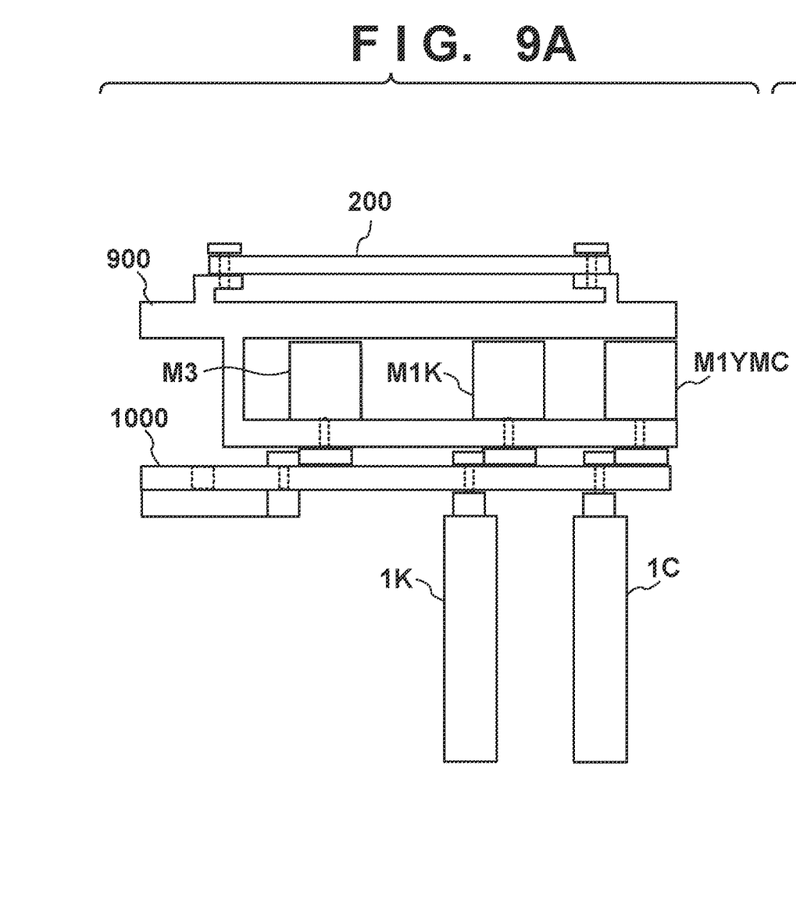
FIGS. 9A and 9B are schematic cross-sectional views of motor assemblies that can be attached to and detached from a printer.
Figure 9B:
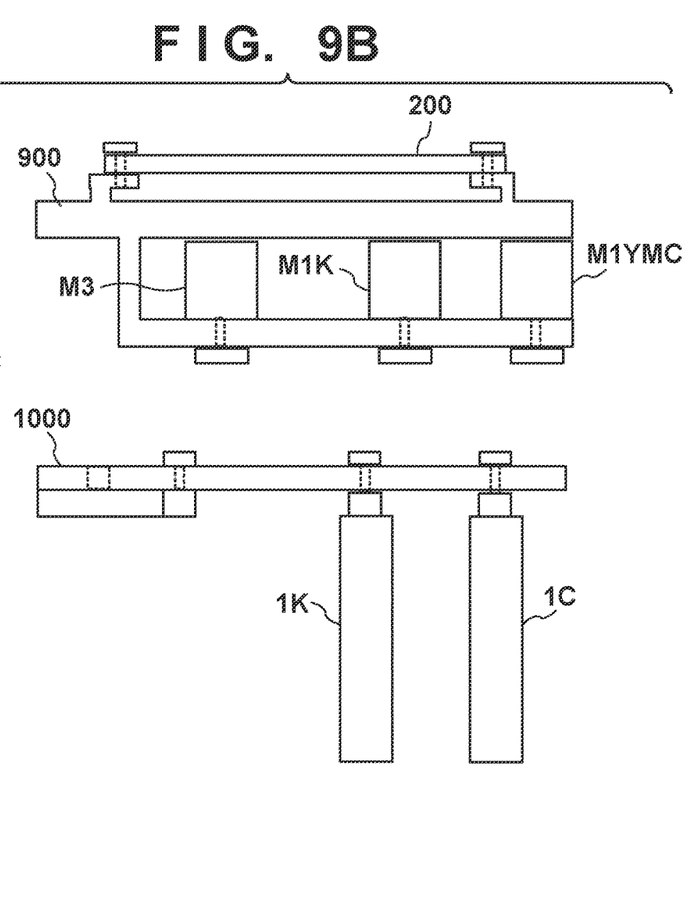

FIGS. 8, 9A, and 9B are schematic diagrams of main portions of a printed circuit board 200 according to a second embodiment. With the printed circuit board 200 shown in FIG. 8, connectors and marks provided around the connectors are different from the connectors and marks of the first embodiment. Note that other constituent elements of the printed circuit board 200 of the second embodiment are the same as the constituent elements of the printed circuit board 200 of the first embodiment. Thus, shared constituent elements will not be described herein.

The printed circuit board 200 shown in FIG. 8 includes connectors 800 to 809. The connector 800 is connected to a connector of a control line extending from a motor M1K. The connector 801 is connected to a connector of a control line extending from a motor M1YMC. The connector 802 is connected to a connector of a control line extending from a motor M2K. The connector 803 is connected to a connector of control lines extending from motors M2Y, M2M, and M2C. The connector 804 is connected to a connector of a control line extending from a motor M3 for rotating secondary transfer rollers 9. Other connectors 805 to 809 are connected to control lines extending from an operation panel 126, a temperature sensor 204, a DC load 213, and a sensor group 214.

The printed circuit board 200 is provided with marks indicating regions occupied by the connectors 800 to 809 around the connectors 800 to 809. These occupied regions indicate positions at which the connectors 800 to 809 are arranged. Also, the printed circuit board 200 is provided with marks 810 to 819 in the vicinities of the connectors 800 to 809. The marks 810 to 819 include identification numbers (J0 to J9) for identifying which of the connectors 800 to 809 is to be connected to.

Also, the marks 810, 812, and 814 are obtained by enclosing identification numbers (J0, J2, and J4) in rectangles. Herein, the marks 810, 812, and 814 indicate that the connectors 800, 802, and 804 are commonized connectors that are used in both a monochrome printer 30' and a color printer 30. On the other hand, marks 811 and 813 are obtained by enclosing identification numbers (J1 and J3) in double-rectangles. The marks 811 and 813 indicate that the connectors 801 and 803 are dedicated connectors that are used only in the color printer 30.

Incidentally, the connectors 805 to 809 corresponding to the marks 815 to 819 are also commonized connectors. However, the marks 815 to 819 are different from the marks 810, 812, and 814. That is, unlike the marks 810, 812, and 814, with regard to the marks 815 to 819, identification numbers are not enclosed in rectangles. These marks are designed taking the convenience for an operator to maintain and assemble the color printer 30 (or the monochrome printer 30') into consideration. Hereinafter, reasons why the marks 815 to 819 are different from the marks 800 to 804 will be described with reference to FIGS. 9A and 9B.

FIG. 9A is a schematic cross-sectional view of a motor assembly 900 in a state in which the motor assembly 900 is mounted on a rear side plate 1000 of the color printer 30 (the monochrome printer 30'). On the other hand, FIG. 9B is a schematic cross-sectional view of the motor assembly 900 in a state in which the motor assembly 900 is detached from the rear side plate 1000. The motor assembly 900 is a sub-unit in which motor units 211a and 211b, a motor M3, and a printed circuit board 200 are fixed to a housing. Herein, the motor M3 is a driving source for rotating and driving a secondary transfer roller 9.

In an image forming apparatus 100 (or an image forming apparatus 100'), the motor assembly 900 can be attached to or detached from the rear side plate 1000 of the color printer 30 (the monochrome printer 30'). When the motor assembly 900 is mounted on the rear side plate 1000, a gear of the motor M1 and a gear of a photosensitive drum 1 are connected to each other to be capable of transmitting driving force, and a gear of the motor M2 and a gear for driving a replenishment mechanism are connected to each other to be capable of transmitting driving force. Similarly, when the motor assembly 900 is mounted on the rear side plate 1000, a gear of the motor M3 and a gear for driving the secondary transfer rollers 9 are connected to each other to be capable of transmitting driving force. Accordingly, as a result of an operator mounting the motor assembly 900 on the rear side plate 1000, the efficiency of an assembly operation is improved. Also, as a result of an operator detaching the motor assembly 900 from the rear side plate 1000, an operator can easily gain access to the photosensitive drum 1 and the secondary transfer rollers 9 during maintenance.

Herein, the motor units 211a and 211b and the motor M3 that are fixed as the motor assembly 900 to the same housing as the printed circuit board 200 are detached all at once from the rear side plate 1000 together with the printed circuit board 200. Thus, when an operator detaches the motor assembly 900 from the rear side plate 1000, the operator does not need to detach the connectors of all of the control lines from the connectors 800 to 809 of the printed circuit board 200. That is, the marks 810 to 814 of the printed circuit board 200 allow an operator to recognize that when the motor assembly 900 is detached from the rear side plate 1000, the connectors of the control lines need not be detached from the connectors 800 to 804. Accordingly, the time and effort required when an operator detaches the motor assembly 900 decrease, and the operation time can be shortened. Thus, according to the printed circuit board 200 of the present embodiment, not only can an operator easily distinguish between a commonized connector and a dedicated connector, but also the efficiency of a maintenance operation can be improved.

In this manner, the image forming apparatus 100' is an example of a monochromatic image forming apparatus. The monochrome printer 30' is an example of an image forming unit that forms a black image. The motors M1K and M2K are examples of motors driving an image forming unit to form a black image. The motor control circuit 207 is an example of a control circuit that controls a motor. The connectors 301a and 301c are examples of a first connector to which a motor is connected via a control line. The connectors 301b and 301d are examples of a second connector to which a control target is not connected. The printed circuit board 200 is an example of a substrate on which the control circuit, the first connector, and the second connector are arranged. The marks 310b and 310d are examples of a predetermined mark formed on a substrate through silk screen printing. The distance between a predetermined mark and a second connector of the substrate is shorter than the distance between the predetermined mark and a first connector of the substrate. If the substrate is disposed on the image forming apparatus 100 (a color machine), which is a multi-color image forming apparatus that forms color images, the motor M1YMC and the motors M2Y, M2M, and M2C, which are control targets for the multi-color image forming apparatus, are connected to second connectors.

The image forming unit may have a photoreceptor (the photosensitive drum 1K) on which an electrostatic latent image is formed, and a development sleeve (the development sleeve 4K) that develops the electrostatic latent image formed on the photoreceptor, using black toner. The motor (the motor M1K) rotates the photoreceptor.

The image forming unit may have a photoreceptor (the photosensitive drum 1K) on which an electrostatic latent image is formed, and a development sleeve (the development sleeve 4K) that develops the electrostatic latent image formed on the photoreceptor, using black toner. The motor (the motor M1K) rotates the sleeve.

The image forming unit may have a photoreceptor on which an electrostatic latent image is to be formed, a development sleeve that develops the electrostatic latent image formed on the photoreceptor, using black toner, and a mounting portion (the mounting portion 16K) on which a housing container is mounted. The black toner is housed in the housing container. A motor (the motor M2K) may be driven to replenish the image forming unit with the black toner in the housing container mounted on the mounting portion. As shown in FIG. 5, a predetermined mark may be formed to enclose a region in which a second connector is disposed.

First identification information for a first connector may be formed on a substrate through silk screen printing. Second identification information for a second connector may be formed on a substrate through silk screen printing. A predetermined mark may be added to second identification information. As shown in FIG. 7C, the mark 310 may be a mark provided on information (e.g., connector number) for identifying a plurality of connectors 301. Such information may also be referred to as connector identification information.

As shown in FIG. 7C, a predetermined mark may be formed to enclose second identification information.

As shown in FIG. 7B, a predetermined mark may include at least one of a letter, a figure, and a symbol.

The printed circuit board 200 is an example of a substrate on which a control circuit, a first connector, and a second connector are arranged. A predetermined mark (e.g.: the marks 310a and 310c) formed through silk screen printing may be formed on a substrate. The distance between a predetermined mark and a first connector of the substrate is shorter than the distance between the predetermined mark and a second connector of the substrate. If the substrate is disposed in a multi-color image forming apparatus (e.g.: the image forming apparatus 100 (a color machine)) that forms color images, a control target (e.g.: the motor M1YMC, and the motors M2Y, M2M, and M2C) for the multi-color image forming apparatus is connected to a second connector.

As shown in FIG. 6, a predetermined mark may be formed to enclose a region in which a first connector is disposed.

As shown in FIG. 7C, a predetermined mark may be added to first identification information. A predetermined mark may be formed to enclose second identification information. A predetermined mark may include at least one of a letter, a figure, and a symbol.

The image forming apparatus 100 (a color machine) is an example of an image forming apparatus. The color printer 30 is an example of an image forming unit that forms images using toner having different colors. The motors M1K and M2K are examples of a first motor configured to drive an image forming unit to form a black image using black toner. The motor M1YMC, and the motors M2Y, M2M, and M2C are examples of a second motor configured to drive an image forming unit to form a color image using color toner. The connectors 301a and 301c are examples of a first connector to which a first motor is connected via a first control line. The connectors 301b and 301d are examples of a second connector to which a second motor is connected via a second control line. The printed circuit board 200 is an example of a substrate on which the control circuit, the first connector, and the second connector are arranged. The marks 310b and 310d are examples of a predetermined mark formed on a substrate through silk screen printing. The distance between a predetermined mark and a second connector of the substrate is shorter than the distance between the predetermined mark and a first connector of the substrate. If the substrate is disposed in the image forming apparatus 100', which is a monochromatic image forming apparatus that forms only black images, there is no motor that is to be connected to the second connector.

First identification information for a first connector is formed on a substrate through silk screen printing. Second identification information for a second connector is formed on a substrate through silk screen printing. As shown in FIG. 7B, a predetermined mark may be added to the second identification information.

Alternatively, the distance between a predetermined mark and a first connector of the substrate is shorter than the distance between the predetermined mark and a second connector of the substrate. If the substrate is disposed in the image forming apparatus 100', which is a monochromatic image forming apparatus that forms only black images, there is no motor that is to be connected to the second connector. First identification information for a first connector may be formed on the substrate through silk screen printing. Second identification information for a second connector may be formed on the substrate through silk screen printing. A predetermined mark may be added to first identification information.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-121188, filed Jun. 26, 2018, which is hereby incorporated by reference herein in its entirety.

What is claimed is:

1. A monochromatic image forming apparatus comprising:
    an image forming unit configured to form a black image;
    a motor configured to drive the image forming unit;
    a control circuit configured to control the motor;
    a first connector to which the motor is connected via a control line;
    a second connector to which a control target is not connected;
    a substrate on which the control circuit, the first connector, and the second connector are arranged; and
    a predetermined mark formed on the substrate through silk screen printing,
    wherein a distance between the predetermined mark and the second connector of the substrate is shorter than a distance between the predetermined mark and the first connector of the substrate, and
    if the substrate is disposed in a multi-color image forming apparatus configured to form a color image, a control target for the multi-color image forming apparatus is connected to the second connector.

2. The monochromatic image forming apparatus according to claim 1,
    wherein the image forming unit includes a photoreceptor on which an electrostatic latent image is to be formed, and a development sleeve configured to develop, using black toner, the electrostatic latent image formed on the photoreceptor, and
    the motor is configured to rotate the photoreceptor.

3. The monochromatic image forming apparatus according to claim 1,
    wherein the image forming unit includes a photoreceptor on which an electrostatic latent image is to be formed, and a development sleeve configured to develop, using black toner, the electrostatic latent image formed on the photoreceptor, and
    the motor is configured to rotate the sleeve.

4. The monochromatic image forming apparatus according to claim 1,
wherein the image forming unit includes a photoreceptor on which an electrostatic latent image is to be formed, a development sleeve configured to develop, using black toner, the electrostatic latent image formed on the photoreceptor, and a mounting portion on which a housing container is mounted,
the motor is driven to replenish the image forming unit with black toner in the housing container mounted on the mounting portion.

5. The monochromatic image forming apparatus according to claim 1,
wherein first identification information for the first connector is formed on the substrate through silk screen printing,
second identification information for the second connector is formed on the substrate through silk screen printing, and
the predetermined mark is added to the second identification information.

6. A monochromatic image forming apparatus comprising:
an image forming unit configured to form a black image;
a motor configured to drive the image forming unit;
a control circuit configured to control the motor;
a first connector to which the motor is connected via a control line;
a second connector to which a control target is not connected;
a substrate on which the control circuit, the first connector, and the second connector are arranged; and
a predetermined mark formed on the substrate through silk screen printing,
wherein a distance between the predetermined mark and the first connector of the substrate is shorter than a distance between the predetermined mark and the second connector of the substrate, and
if the substrate is disposed in a multi-color image forming apparatus configured to form a color image, a control target for the multi-color image forming apparatus is connected to the second connector.

7. The monochromatic image forming apparatus according to claim 6,
wherein the image forming unit includes a photoreceptor on which an electrostatic latent image is to be formed, and a development sleeve configured to develop, using black toner, the electrostatic latent image formed on the photoreceptor, and
the motor is configured to rotate the photoreceptor.

8. The monochromatic image forming apparatus according to claim 6,
wherein the image forming unit includes a photoreceptor on which an electrostatic latent image is to be formed, and a development sleeve configured to develop, using black toner, the electrostatic latent image formed on the photoreceptor, and
the motor is configured to rotate the sleeve.

9. The monochromatic image forming apparatus according to claim 6,
wherein the image forming unit includes a photoreceptor on which an electrostatic latent image is to be formed, a development sleeve configured to develop, using black toner, the electrostatic latent image formed on the photoreceptor, and a mounting portion on which a housing container is mounted,
the motor is driven to replenish the image forming unit with black toner in the housing container mounted on the mounting portion.

10. The monochromatic image forming apparatus according to claim 6,
wherein first identification information for the first connector is formed on the substrate through silk screen printing,
second identification information for the second connector is formed on the substrate through silk screen printing, and
the predetermined mark is added to the first identification information.

11. A substrate usable with a monochromatic image forming apparatus and usable with a multi-color image forming apparatus, the substrate comprising:
a first connector;
a second connector; and
a predetermined mark formed on the substrate through silk screen printing,
wherein a distance between the predetermined mark and the second connector is shorter than a distance between the predetermined mark and the first connector,
wherein if the substrate is disposed in the monochromatic image forming apparatus, (i) the first connector is connected via a cable to a motor for driving a rotational photosensitive member on which a black image is formed, and (ii) the second connector is unconnected, and
wherein if the substrate is disposed in the multi-color image forming apparatus, (iii) the first connector is connected via a first cable to a first motor for driving a first rotational photosensitive member on which a black image is formed, and (iv) the second connector is connected to a second motor for driving a second rotational photosensitive member on which a color image is formed.

12. The substrate according to claim 11,
wherein a first mark for the first connector is formed on the substrate by silk-screen printing,
wherein a second mark for the second connector is formed on the substrate by silk-screen printing, and
wherein the predetermined mark is added to the second mark.

13. The substrate according to claim 11,
wherein a first identification number for the first connector is formed on the substrate by silk-screen printing,
wherein a second identification number for the second connector is formed on the substrate by silk-screen printing, and
wherein the predetermined mark comprises a mark of a rectangle shape.

14. A substrate usable with a monochromatic image forming apparatus and usable with a multi-color image forming apparatus, the substrate comprising:
a first connector;
a second connector; and
a predetermined mark form on the substrate through silk screen printing,
wherein a distance between the predetermined mark and the first connector is shorter than a distance between the predetermined mark and the second connector,
wherein if the substrate is disposed in the monochromatic image forming apparatus, (i) the first connector is connected via a cable to a motor for driving a rotational photosensitive member on which a black image is formed, and (ii) the second connector is unconnected, and wherein if the substrate is disposed in the multi-color image forming apparatus, (iii) the first connector is connected via a first cable to a first motor for driving a first rotational photosensitive member on which a black image is formed, and (iv) the second connector is connected to a second motor for driving a second rotational photosensitive member on which a color image is formed.

15. The substrate according to claim 14,
wherein a first mark for the first connector is formed on the substrate by silk-screen printing,
wherein a second mark for the second connector is formed on the substrate by silk-screen printing, and
wherein the predetermined mark is added to the first mark.

16. The substrate according to claim 14,
wherein a first identification number for the first connector is formed on the substrate by silk-screen printing,
wherein a second identification number for the second connector is formed on the substrate by silk-screen printing, and
wherein the predetermined mark comprises a mark of a rectangle shape.

17. A substrate usable with a monochromatic image forming apparatus and usable with a multi-color image forming apparatus, the substrate comprising:
a first connector;
a second connector; and
a predetermined mark formed on the substrate through silk screen printing,
wherein a distance between the predetermined mark and the second connector is shorter than a distance between the predetermined mark and the first connector,
wherein if the substrate is disposed in the monochromatic image forming apparatus, (i) the first connector is connected via a cable to a motor for driving a rotational photosensitive member on which a black image is formed, and (ii) the second connector is not connected to a motor, and
wherein if the substrate is disposed in the multi-color image forming apparatus, (iii) the first connector is connected via a first cable to a first motor for driving a first rotational photosensitive member on which a black image is formed, and (iv) the second connector is connected to a second motor for driving a second rotational photosensitive member on which a color image is formed.

18. The substrate according to claim 17,
wherein a first mark for the first connector is formed on the substrate by silk-screen printing,
wherein a second mark for the second connector is formed on the substrate by silk-screen printing, and
wherein the predetermined mark is added to the second mark.

19. The substrate according to claim 17,
wherein a first identification number for the first connector is formed on the substrate by silk-screen printing,
wherein a second identification number for the second connector is formed on the substrate by silk-screen printing, and
wherein the predetermined mark comprises a mark of a rectangle shape.

20. A substrate usable with a monochromatic image forming apparatus and usable with a multi-color image forming apparatus, the substrate comprising:
a first connector;
a second connector; and
a predetermined mark formed on the substrate through silk screen printing,
wherein a distance between the predetermined mark and the first connector is shorter than a distance between the predetermined mark and the second connector,
wherein if the substrate is disposed in the monochromatic image forming apparatus, (i) the first connector is connected via a cable to a motor for driving a rotational photosensitive member on which a black image is formed, and (ii) the second connector is not connected to a motor, and
wherein if the substrate is disposed in the multi-color image forming apparatus, (iii) the first connector is connected via a first cable to a first motor for driving a first rotational photosensitive member on which a black image is formed, and (iv) the second connector is connected to a second motor for driving a second rotational photosensitive member on which a color image is formed.

21. The substrate according to claim 20,
wherein a first mark for the first connector is formed on the substrate by silk-screen printing,
wherein a second mark for the second connector is formed on the substrate by silk-screen printing, and
wherein the predetermined mark is added to the first mark.

22. The substrate according to claim 20,
wherein a first identification number for the first connector is formed on the substrate by silk-screen printing,
wherein a second identification number for the second connector is formed on the substrate by silk-screen printing, and
wherein the predetermined mark comprises a mark of which shape is rectangle.

* * * * *